United States Patent [19]

Schultz et al.

[11] 4,066,965
[45] Jan. 3, 1978

[54] RF GTWT SATURATING CIRCUIT

[75] Inventors: Leonard J. Schultz, Culver City; Alfred Steven Hamori, Huntington Beach; Robert Rosen, Granada Hills, all of Calif.

[73] Assignee: The United States of America as represented by the Secretary of the Navy, Washington, D.C.

[21] Appl. No.: 727,559

[22] Filed: Sept. 28, 1976

[51] Int. Cl.$^2$ .......................... H04B 1/04; H01J 25/34
[52] U.S. Cl. .................................... 325/120; 325/187; 330/43; 343/17.7
[58] Field of Search ............... 325/120, 121, 144, 159, 325/187; 330/4.6, 43, 29, 26; 343/5 ST, 17.7

[56] References Cited

U.S. PATENT DOCUMENTS

| | | | |
|---|---|---|---|
| 2,648,007 | 8/1953 | Witkowski | 343/17.7 |
| 3,038,068 | 6/1962 | MacDowell et al. | 330/43 |
| 3,123,771 | 3/1964 | Poole | 330/43 |
| 3,320,536 | 5/1967 | Lockwood | 325/144 |
| 3,943,446 | 3/1976 | Quidort | 325/144 |

FOREIGN PATENT DOCUMENTS 706,984  3/1965  Canada .................................. 330/43

OTHER PUBLICATIONS

Transmitter System for Spacecraft Tests, by J. A. Knight, Conference: Meeting on Skynet, London, England, 4/20/70, pp. 178–188.
Traveling-Wave Tubes in Missile-Borne Transmitters, by Dr. Libby, Microwave Journal, vol. 19, No. 1, pp. 49–52, Jan. 1976.

Primary Examiner—Robert L. Griffin
Assistant Examiner—Tommy P. Chin
Attorney, Agent, or Firm—R. Sciascia; R. Beers; S. Sheinbein

[57] ABSTRACT

A circuit to control the RF drive to a gridded traveling wave tube (GTWT) to operate the tube in saturation across the entire RF band and at all PRF's and pulse widths. Control is attained by sensing the GTWT output and using a feedback circuit to vary an input variable attenuator to the GTWT based upon whether the output is increasing or decreasing.

7 Claims, 2 Drawing Figures

RF GTWT SATURATING CIRCUIT

BACKGROUND OF THE INVENTION

This invention relates generally to RF amplifiers, and more particularly to RF gridded traveling wave tubes (GTWT's).

A GTWT is basically a wide band, high power RF amplifier which is grid controlled to allow for highly flexible usage in transmitters requiring numerous modes of operation at different pulse repetition frequencies (PRF's) and pulse widths. As such, GTWT's are often used in high power radar transmitters. One problem which has been found to exist, however, in such radar usage has been meeting the requirement of continuously operating the GTWT at saturation to provide optimum radar performance. Such operation is desirable inasmuch as RF power output is maximized and the RF noise is minimized when the GTWT is at saturation.

The prior art approach to resolving this problem has basically revolved around providing an equalizer (a passive filter device) installed at the tube manufacturer in the input of the GTWT. This device attenuates the drive to the GTWT at certain points in a perdetermined frequency band such that it will always be saturated or close to saturation. However, in order for the equalizer to operate properly, the radar master oscillator (RMO) and the transmitter power supplies must be set to tight tolerances to provide an RF drive within the narrow ranges the equalizer can control (e.g. 50 mw ± 1db in a typical high power radar). Also, any drift due to aging or temperature of the RMO or the power supplies in the transmitter may cause either unit to be out of tolerance. When the RF is not optimized, the RF output power drops, the AM noise on the RF output power increases, and the shape of the RF output power pulse changes which may cause the RF spectrum shape to be out of tolerance.

SUMMARY OF THE INVENTION

Accordingly, there is provided a circuit to operate a GTWT at saturation across the entire RF band at all PRF's and pulse widths without the need for maintaining the driving RF oscillator and transmitter power supplies at tight tolerances. The RF output power of the GTWT is sensed to determine whether it is at its peak level or increasing or decreasing. If the output is increasing or decreasing, a control circuit will adjust an input variable attenuator to increase or decrease the input RF drive until the output is maximized. In a first embodiment of the invention the output pulses of the GTWT are converted to a binary number indicative of amplitude and then compared digitally on a pulse-to-pulse basis to control a digital clock which controls the attenuator. A second embodiment of the invention provides an analog decrease detector circuit to provide comparison data to the digital clock.

OBJECTS OF THE INVENTION

It is therefore an object of the present invention to provide improved GTWT RF operation.

Another object of the present invention is to provide a circuit for continuous saturation of a GTWT across the entire RF band.

A further object of the present invention is to provide a saturation circuit for GTWT operation at maximum output power and minimum RF AM noise.

Yet another object of the present invention is to provide a saturation circuit for GTWT operation in an RF transmitter which avoids the need for equalizers and tight tolerances of the RF drive oscillator and transmitter power supplies.

BRIEF DESCRIPTION OF THE DRAWINGS

These and other objects, features and attendant advantages to the present invention will become better understood by refernce to the following detailed description when considered in connection with the accompanying drawing wherein.

DETAILED DESCRIPTION OF THE PREFERRED EMBODIMENT

Figure 1:
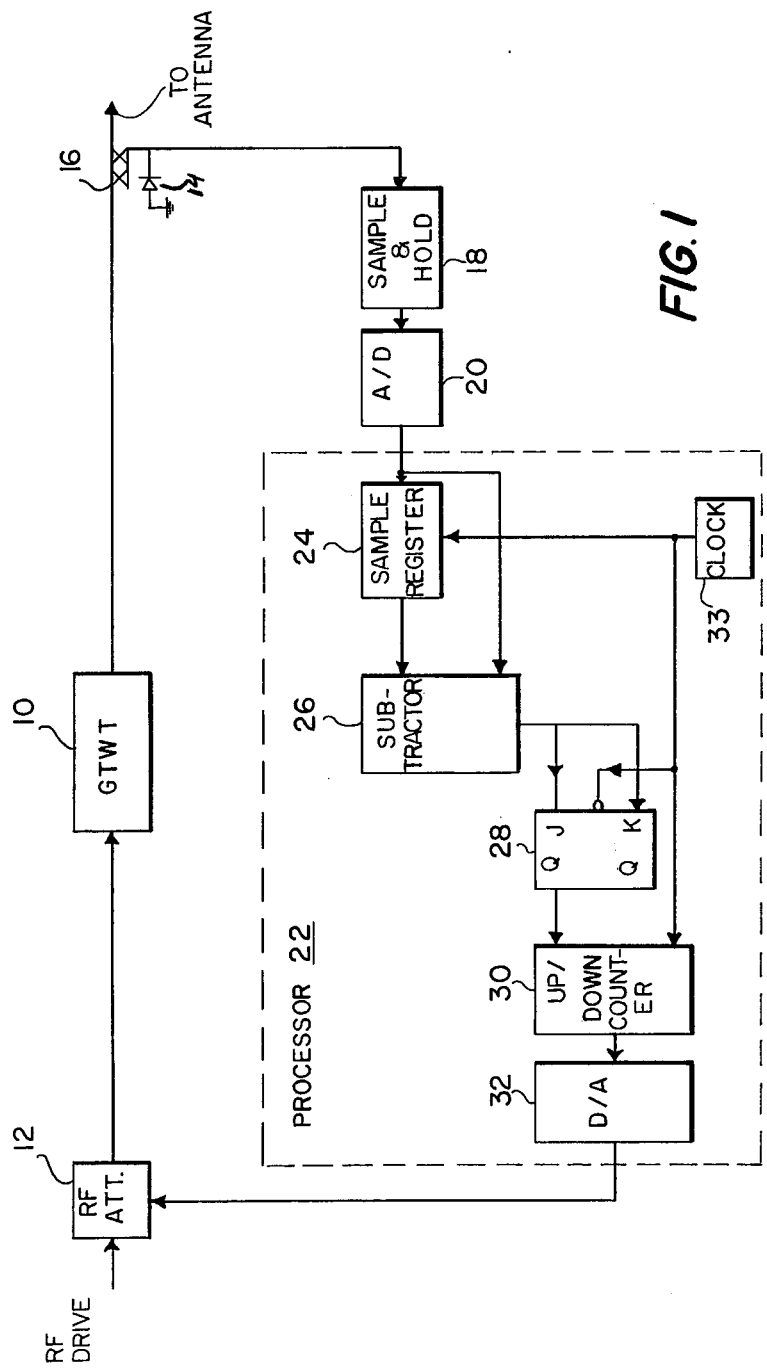
FIG. 1 shows a block diagram of a first embodiment of the present invention having a digital controller.

Referring now to the drawings, wherein like reference numerals designate identical or corresponding parts through the several views, and more particularly to FIG. 1, there is shown a GTWT 10 coupled to an input RF drive signal (for example from a Radar Master Oscillator) by a variable RF attenuator 12 which controls the drive to the GTWT. RF power output pulses from GTWT 10 are sensed by detector 14, which is coupled to the GTWT output by coupler 16, and the detected pulses are then fed into sample and hold circuit 18 which detects the pulse peaks. It is a particular characteristic of GTWT's that the RF output is a maximum when they are saturated. Thus, when the GTWT is at this point, any increase or decrease of the RF drive will cause oversaturation or non-saturation, respectively, and will decrease the GTWT output power. This decrease in GTWT output power will be reflected in a corresponding decrease of the pulse peak detected by sample and hold circuit 18 which gives an output of a DC voltage equal to the GTWT pulse output.

Analog-to-Digital converter 20 converts the pulse output of sample and hold circuit 18 into a 12-bit digital number to allow coupling the signal to digital processor 22. Typically, A/D converter 20 should be able to sense 0.6 mv increments of input voltage. Processor 22 is coupled between A/D converter 20 and variable RF attenuator 12 to monitor the output of A/D converter 20 and adjust the drive to GTWT 10 accordingly via the variable RF attenuator. If the detected RF is increasing, then the direction of change of RF attenuator 12 biasing is not altered. If, however, the detected RF is decreasing, then the direction of change of RF attenuator 12's biasing drive is reversed.

Processor 22 comprises a subtractor 26 with one terminal coupled directly to the output of A/D converter 20 and another terminal coupled to the A/D converter via sample register 24. The output of subtractor 26 couples to multivibrator 28 which, in turn, controls up-down counter 30. Digital-to-Analog converter 32 allows conversion of the digital output of up-down counter 30 to an analog control signal to adjust variable RF attenuator 12. A 10H$_z$ clock 33 is coupled to sample register 24, multivibrator 28 and up-down counter 30 to ensure proper timing.

In operation of processor 22, sample register 24 stores each sample of A/D converter 20 until the next sample is taken. This stored sample is then fed to subtractor 26 where it is subtracted from a new sample taken directly from A/D converter 20. If the new sample is greater than the old sample, thus indicating that the power output of the GTWT is increasing, the output of subtractor 26 will be a "0" logic level. If, however, the old value is greater, thereby indicating a decreasing GTWT output, subtractor 26 will give a "1" logic level output. Multivibrator 28 responds to the output of subtractor 26 by being toggled if the output is "1" and remaining at its present state if the output is "0." Each time multivibrator 28 is toggled it changes the direction in which up-down counter 30 counts and this, in turn, will increase the attenuation of variable RF attenuator 12. Thus, whenever an incrementing or decrementing of input drive to the GTWT results in increased detected RF GTWT output, the direction of drive adjustment is unchanged, whereas if the drive adjustment results in decreased power, then the direction of adjustment is reversed. Processor 22 uses this sequence of adjustments and comparison of inputs to find the peak of the saturation curve called the saturation point. Once the peak is found, the drive level dithers across this level, thereby "holding" it. No variation in temperature will affect it because the circuit is continually testing the input level for effects to drive variations.

Figure 2:
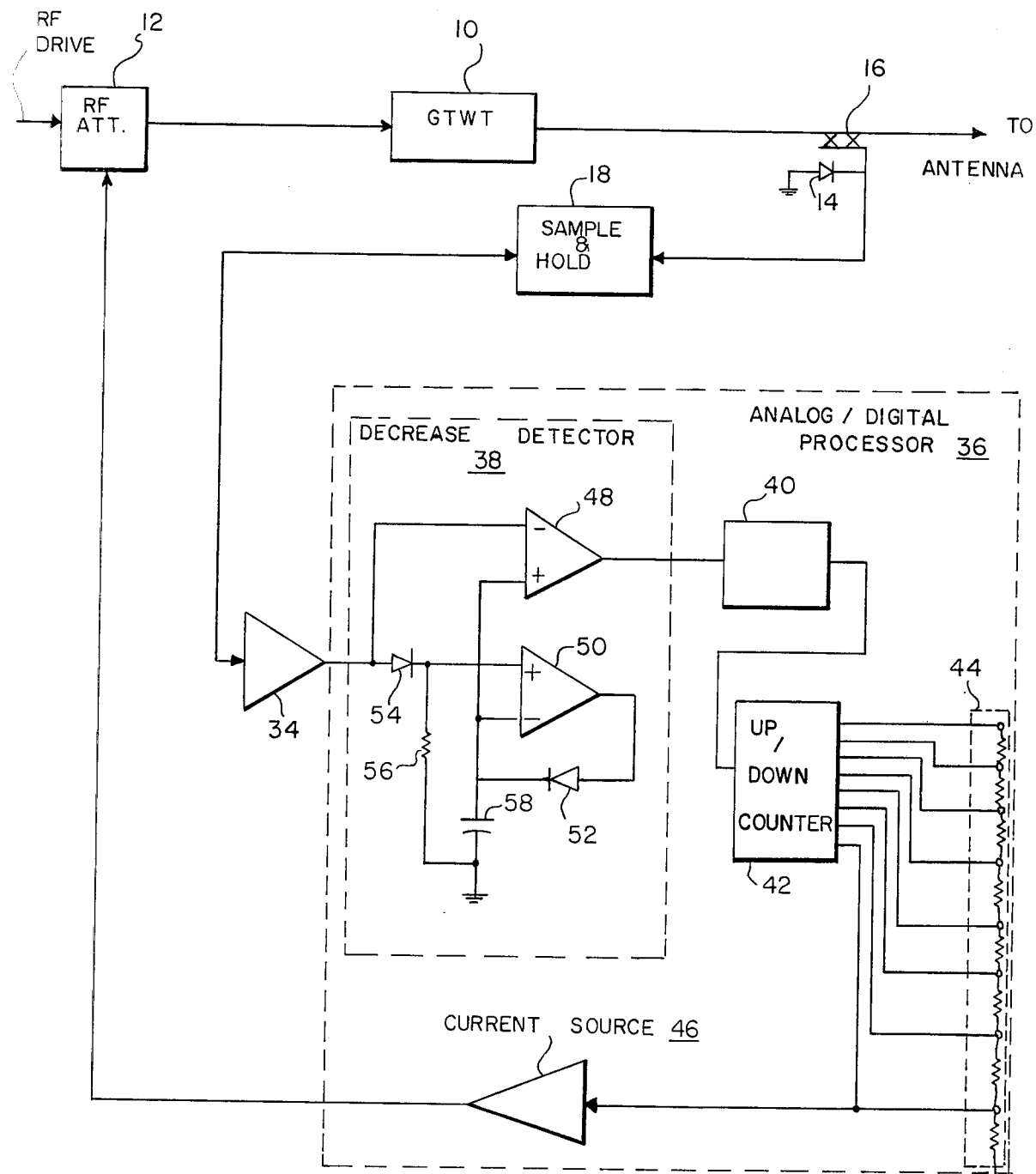
FIG. 2 shows a partial block and partial schematic diagram of a second embodiment of the present invention having a hybrid controller.

FIG. 2 shows an alternative embodiment of the invention using a hybrid analog/digital processor rather than a purely digital one. The circuit elements are the same as in FIG. 1 up to the output of sample and hold circuit 18. This d.c. voltage output, equal to the pulse amplitude output of GTWT 10, is amplified in narrow band amplifier 34 and then fed into the analog/digital processor 36 an as analog signal. Typically, amplifier 34 would be a 1000X amplifier with a bandpass of 3 Hz to 100 Hz to minimize amplification of system noise such as 400 Hz lines and their harmonics.

The analog/digital processor 36 comprises a decrease detector 38, coupled to the output of amplifier 34, bistable multivibrator 40, up-down counter 42, R/2 voltage ladder 44 and current source 46. Decrease detector 38 in turn comprises two differential amplifiers, 48 and 50, with the negative input of differential amplifier 48 being coupled directly to the output of amplifier 34 while the positive input is taken from the output of differential amplifier 50 via diode 52. The positive input of differential amplifier 50 is coupled to amplifier 34 via diode 54 while its negative input is taken as a feedback signal from its own output via diode 52. Resistor 56 is coupled between the output of diode 54 and ground, and capacitor 58 is coupled between the output of diode 52 and ground. Bistable Multivibrator 40 is fed directly from the output of differential amplifier 48 and its output, in turn, controls up-down counter 42. Up-down counter 42 has an eight BIT output which drives R/2 voltage ladder 44 and the current source 46 (typically an operational amplifier) which couples to variable RF attenuator 12.

In operation of the FIG. 2 embodiment, increasing output from GTWT 10 will cause an increase in the voltage output of amplifier 34 which charges differential amplifier 50 and capacitor 58 to the same voltage level. If the output from GTWT 10 begins to decrease, either because it is no longer in saturation or is over saturated, the voltage will be stored in capacitor 58. When the voltage from amplifier 34 drops a predetermined amount (for example 0.7 volts as a typical one diode drop) the positive input to differential amplifier 48 will be higher than the negative input and this will lead to triggering bistable multivibrator 40. The change of state of bistable multivibrator 40 reverses the direction of up-down counter 42 and this, in turn, reverses the drive on GTWT 10 by reversing the attenuation of variable attenuator 12. The clock pulse rate of up-down counter 42 is preferably about 200 Hz and the search rate of the output is approximately 12 Hz when the analog/digital processor 36 is operating about the GTWT saturation point.

There has therefore been provided means for controlling the RF drive to a GTWT to operate in saturation across the entire RF band to allow maximum RF power output and minimum RF AM noise. Obviously, numerous modifications and variations of the present invention are possible in light of the above teachings. It is therefore to be understood that within the scope of the appended claims the invention may be practiced otherwise than as specifically described herein.

What is claimed and desired to be secured by Letters Patent of the United States is:

1. A circuit to maintain an RF gridded traveling wave tube in a saturation condition comprising:
    an RF drive input;
    a variable RF attenuator coupled to said RF drive input;
    a gridded traveling wave tube coupled to the output of said variable RF attenuator, said gridded traveling wave tube having an output power which is maximum when said tube operates at its saturation point;
    means for sensing the output power of said gridded traveling wave tube, said sensing means comprising sample and hold means coupled to said sensing means to detect the peaks of the output pulses of said gridded traveling wave tube; and
    control means coupled to said sample and hold means and said variable RF attenuator for adjusting said variable RF attenuator in accordance with variations of the sensed output power of said gridded traveling wave tube to maintain said tube at its saturation point.

2. A circuit to maintain an RF gridded traveling wave tube in a saturated condition comprising:
    an RF drive input;
    a variable RF attenuator coupled to said RF drive input;
    a gridded traveling wave tube coupled to the output of said variable RF attenuator, said gridded traveling wave tube having an output power which is maximum when said tube operates at its saturation point;
    means for sensing the output power of said gridded traveling wave tube; and
    control means coupled to said sensing means and said variable RF attenuator for adjusting said variable RF attenuator in accordance with variations of the sensed output power of said gridded traveling wave tube to maintain said tube at its saturation point, wherein said control means comprises:
    an analog-to-digital converter coupled to said sensing means to convert the output power of pulses of said gridded traveling wave tube to a digital value;
    digital comparison means coupled to the output of said analog-to-digital converter for comparing the digital values of successive output pulses and providing an output based upon whether the power of said pulses is increasing or decreasing; and a digital-to-analog converter coupled to the output of said digital comparison means and said variable RF attenuator to convert said digital output of said digital comparison means to an analog adjusting signal for said variable RF attenuator.

3. A circuit as set forth in claim 2 wherein said sensing means comprises:
   a coupler located at the output of said gridded traveling wave tube;
   a diode detector coupled to said coupler means; and
   sample and hold means coupled to said diode detector to detect the peaks of the output pulses of said gridded traveling wave tube.

4. A circuit as set forth in claim 2 wherein said digital comparison means comprises:
   a sample register coupled to the output of said analog-to-digital converter to store each digital signal from said converter until a new digital signal output is entered; and
   a subtractor coupled to the output of said sample register and the output of said analog-to-digital to compare the stored digital signal from said sample register with the new digital signal from said analog-to-digital converter, and to give an output signal based upon whether said stored digital signal is greater or less than said new digital signal.

5. A circuit as set forth in claim 4 wherein said digital comparison means further comprises:
   a multivibrator coupled to said subtractor output and responsive to whether said output indicates that the stored digital signal is greater or less than said new digital signal; and
   an up-down counter coupled to said multivibrator, and said digital-to-analog converter, the direction of counting of said up-down counter being dependent upon whether said stored digital signal is greater or less than said new digital signal, wherein the attenuation of said variable RF attenuator is controlled by the direction of counting of said up-down counter.

6. A circuit to maintain an RF gridded traveling wave tube in a saturated condition comprising:
   an RF drive input;
   a variable RF attenuator coupled to said RF drive input;
   a gridded traveling wave tube coupled to the output of said variable RF attenuator, said gridded traveling wave tube having an output power which is maximum when said tube operates at its saturation point;
   means for sensing the output power of said gridded traveling wave tube;
   control means coupled to said sensing means and said variable RF attenuator for adjusting said variable RF attenuator in accordance with variations of the sensed output power of said gridded traveling wave tube to maintain said tube at its saturation point, wherein said control means comprises:
   a decrease detector coupled to said sensing means and said variable RF attenuator for adjusting the attenuation of said attenuator in accordance with sensed decreases of successive gridded traveling wave tube output pulses.

7. A circuit as set forth in claim 6 wherein said control means further comprises:
   a multivibrator coupled to the output of said decrease detector, said flip-flop being responsive to indications of decreasing output pulses from said gridded traveling wave tube;
   an up-down counter coupled to the output of said multivibrator;
   an R/2 voltage ladder coupled to the output of said up-down counter; and
   a current source coupled between said R/2 voltage ladder and said variable RF attenuator to control the attenuation of said variable RF attenuator in accordance with the voltage level which said up-down counter has placed on the R/2 voltage ladder.

* * * * *